United States Patent [19]
Whitecar

[11] Patent Number: 5,467,399
[45] Date of Patent: * Nov. 14, 1995

[54] COHERENT SIGNAL GENERATION IN DIGITAL RADIO RECEIVER

[75] Inventor: John E. Whitecar, Plymouth, Mich.

[73] Assignee: Ford Motor Company, Dearborn, Mich.

[ * ] Notice: The portion of the term of this patent subsequent to Oct. 18, 2011, has been disclaimed.

[21] Appl. No.: 298,703

[22] Filed: Aug. 31, 1994

Related U.S. Application Data

[62] Division of Ser. No. 990,143, Dec. 14, 1992, Pat. No. 5,357,574.

[51] Int. Cl.$^6$ .................................................. H04H 5/00
[52] U.S. Cl. .............................. 381/4; 381/15; 455/312; 455/235.1; 331/20; 331/25
[58] Field of Search ...................... 381/15, 4, 7; 331/20, 331/25; 455/312, 235.1

[56] References Cited

U.S. PATENT DOCUMENTS

| 4,887,297 | 12/1989 | Loughlin | 381/15 |
| 4,945,313 | 7/1990 | Brilka et al. | 455/312 |
| 5,261,004 | 11/1993 | Manlove et al. | 381/15 |
| 5,357,574 | 10/1994 | Whitecar | 381/15 |

*Primary Examiner*—Forester W. Isen
*Attorney, Agent, or Firm*—Mark L. Mollon; Roger L. May

[57] ABSTRACT

A digital radio receiver generates coherent signals for synchronous detection without use of a phase-locked loop by employing an adaptive notch filter to cancel the desired signal. The cancelling signal is employed as the coherent signal for synchronous detection. The invention obtains faster locking to the desired signal, a wider capture range, and more efficient software coding in a digital signal processing receiver.

3 Claims, 3 Drawing Sheets

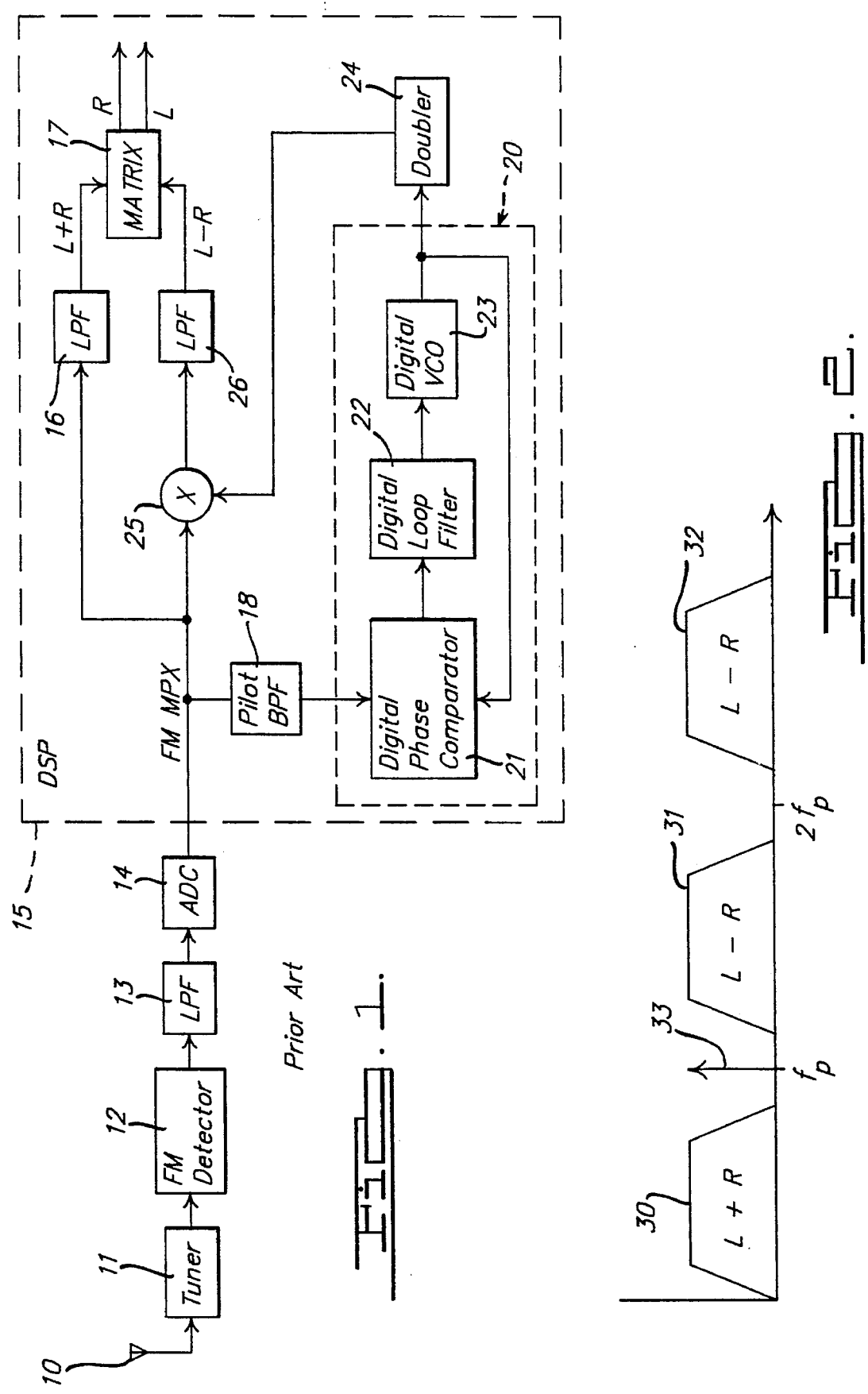

COHERENT SIGNAL GENERATION IN DIGITAL RADIO RECEIVER

This is a divisional of application Ser. No. 07/990,143 filed Dec. 14, 1992 now U.S. Pat. No. 5,357,574.

BACKGROUND OF THE INVENTION

The present invention relates in general to digital radio receivers employing coherent (i.e., synchronous) detection, and more specifically to the generation of a coherent signal using adaptive notch filter techniques, without use of a phase-locked loop.

Coherent detection (i.e., synchronous detection) is a well-known technique employed in a variety of radio receivers, especially receivers for amplitude modulated signals. This type of demodulation requires that the receiver have a signal available with the same phase and frequency as the original modulating signal used prior to signal transmission. Coherent detection is used to demodulate mono and stereo commercial AM broadcasts and the stereo difference channel in commercial FM stereo broadcasts.

The coherent signal used in coherent detection is typically generated using a phase-locked loop (PLL). FM stereo broadcasts include the transmission of a pilot signal which is isolated by the receiver and input to the phase-locked loop. In AM receivers, the PLL locks to the carrier signal which is transmitted as the center frequency of the AM broadcast.

Although commercial AM and FM broadcasts are comprised of a modulated analog signal, it is becoming increasingly popular to convert the received analog signal into a digital signal and to process the radio broadcast signal digitally. Such digital signal processing (DSP) receivers realize various advantages, such as circuit integration, reduced size, exact operation, minimal adjustments, and the ability to combine signal processing for various audio functions (e.g., tone control, concert hall emulation, and equalization).

It is well-known that digital systems must employ a sample rate equal to at least twice the frequency of the analog signal to be represented. Thus, a digital sampling of FM broadcast signals at their transmitted radio frequencies of over 100 MHz would require sample rates in excess of 200 MHz, which is undesirable. Instead, it is desirable to employ an analog tuner to generate a signal at a lower frequency (e.g., a demodulated signal or an intermediate frequency signal) which can be represented using a lower sample rate. For example, a standard analog tuner is employed to generate an FM intermediate frequency (IF) of 10.7 MHz which is FM detected to form an analog FM baseband signal. The baseband signal has a frequency range of from 50 Hz to 53 kHz and is digitized in an analog-to-digital converter (ADC). A pilot signal is isolated from the FM baseband signal using a digital bandpass filter. The pilot signal is then input into a digital phase-locked loop for generating a coherent digital signal.

Digital phase-locked loops suffer several disadvantages. As in any phase-locked loop, the requirement for a loop filter tends to slow down the locking process of the phase-locked loop and also limits the maximum capture range. Furthermore, a digital phase-locked loop employs excessive amounts of processing time and software code.

SUMMARY OF THE INVENTION

The present invention has the advantages of faster locking to a desired signal, a wider capture range, more efficient operation, and reduced software code requirements.

In one aspect, the invention generates a coherent signal using adaptive notch filter techniques. Specifically, a radio receiver generating a coherent signal in response to an input frequency in an input signal comprises summing means having first and second inputs and an output for generating a notched filter signal according to the difference between signals applied to the first and second inputs. The first input is coupled to receive the input signal and the second input is coupled to receiver the coherent signal. A signal source provides a reference signal having a frequency about equal to the input frequency. Adaptive means receives the reference signal and the notch-filtered signal for generating the coherent signal such that the notched-filtered signal is minimized. The reference signal may be comprised of a pilot signal or an intermediate frequency carrier signal. Minimization of the notched-filtered signal is achieved using a least mean squared (LMS) method.

BRIEF DESCRIPTION OF THE DRAWINGS

FIG. 1 is a block diagram showing a prior art radio receiver employing a phase-locked loop.

FIG. 2 shows the transmission spectrum of an FM stereo multiplex broadcast.

FIG. 5 is a block diagram showing the adaptive line enhancement (ALE) filter of FIG. 4.

DETAILED DESCRIPTION OF PREFERRED EMBODIMENTS

Figure 3:
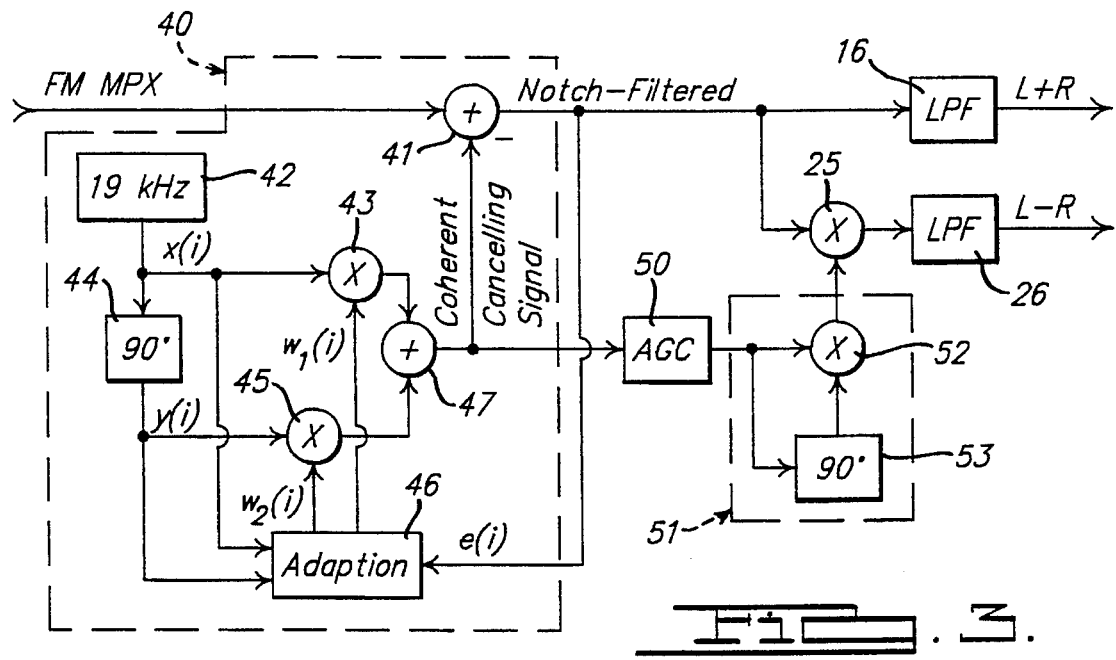
FIG. 3 is a block diagram showing an adaptive-notched filter for generating a coherent signal for FM stereo reception.

FIG. 1 shows a prior art digital receiver employing a digital phase-locked loop (PLL). An antenna 10 receives broadcast radio signals. These radio frequency (RF) signals are coupled to an analog tuner 11 which generates an intermediate frequency (IF) signal. The IF signal is applied to an FM detector 12 where it is demodulated to generate an analog FM multiplex (MPX) signal at baseband. The analog MPX signal is passed through a low-pass filter 13 to an analog-to-digital converter (ADC) 14. Low-pass filter 13 prevents signal aliasing in the digital conversion. A digital FM MPX signal is provided from ADC 14 to a digital signal processing (DSP) block 15.

As shown in FIG. 2, the spectrum of the demodulated FM MPX signal includes a stereo sum channel 30, a stereo difference channel including sidebands 31 and 32, and a stereo pilot signal 33 at a pilot frequency $f_p$ of 19 kHz. The stereo difference channel is amplitude modulated to form a double-sideband suppressed-carrier signal. The suppressed carrier is at frequency $2f_p$ (i.e., 38 kHz) which is recovered from the stereo pilot signal by doubling it.

Returning to FIG. 1, a low-pass filter 16 recovers the stereo sum channel from the FM MPX signal and provides an L+R signal to a stereo decoder matrix 17. A pilot bandpass filter 18 isolates the pilot signal from the FM MPX signal and provides the pilot signal to a phase-locked loop (PLL) 20. Specifically, the filtered pilot signal is coupled to one input of a digital phase comparator 21. The output of phase comparator 21 is coupled through a digital loop filter 22 to a digital voltage-controlled oscillator (VCO) 23. The output of VCO 23 is coupled to the input of a doubler 24 and to a second input of phase comparator 21. When the PLL is locked to the pilot signal, the output from VCO 23 has a phase and frequency equal to the pilot signal but with a constant amplitude and low noise content. The frequency of the VCO signal is doubled in doubler 24. The reconstructed carrier signal is provided to the input of a synchronous detector/mixer 25 for demodulating the stereo difference channel of the FM MPX signal. The demodulated difference channel is passed through a low-pass filter 26 to produce an L−R signal coupled to a second input of matrix 17. The L+R and L−R signals are added and subtracted in matrix 17 to produce right and left stereo signals as is known in the art.

The functions shown in DSP block 15 are implemented using software instructions in a DSP microprocessor. A relatively large amount of software instructions are required in implementing the digital phase comparator, digital loop filter, and digital VCO. Thus, memory space for storing the software instructions and data is relatively large and the execution time required in the DSP microprocessor for implementing the phase-locked loop is relatively long. Furthermore, although the digital loop filter is required in order to provide stability for the phase-locked loop, its presence lengthens the time required for phase-locking and thereby limits the maximum capture range of the phase-locked loop.

The present invention as shown in FIG. 3 avoids these difficulties associated with phase-locked loops. The digital FM MPX signal is input to an adaptive-notch filter 40 which is implemented with DSP software instructions. A summer 41 receives the digital MPX signal at one input. Adaptive-notch filter 40 attempts to minimize the magnitude of a notched-filter signal output from summer 41 as follows. A reference signal source 42 provides a reference signal approximately equal to the frequency of the signal desired to be locked onto, i.e., the 19 kHz pilot signal. The frequency of the reference signal need only be approximately equal to the pilot frequency since any difference in frequency is compensated for by the adaption of the filter. However, capture time is improved if an accurate reference signal is used. Reference source 42 can comprise an oscillator or clock for generating a 19 kHz signal or may be the pilot signal itself derived from a bandpass filter. The reference signal, designated x(i), is input to a multiplier 43 and to a 90° phase shifter 44 to produce a phase-shifted signal designated y(i). Signals x(i) and y(i) can thus be represented as cosine and sine signals, respectively. Signal y(i) is input to a multiplier 45. A set of weights $w_1(i)$ and $w_2(i)$ are coupled to the second inputs of multipliers 43 and 45, respectively. The outputs of multipliers 43 and 45 are summed in a summer 47, the output of which provides the coherent cancelling signal which is connected to a subtracting input on summer 41.

The notched-filter output from summer 41 provides an error signal e(i) to adaption block 46. Adaption block 46 also receives inputs of x(i) and y(i) for calculating the weight values of weights $w_1(i)$ and $w_2(i)$. Weights $w_1$ and $w_2$ are adjusted to change the resultant phase of the coherent cancelling signal to match the pilot signal in the FM MPX signal. Specifically, adaption block 46 adapts weights $w_1$ and $w_2$ according to the following formulas:

$$w_1(i) = w_1(i-1) + x(i) \cdot \mu \cdot e(i), \text{ and}$$

$$w_2(i) = w_2(i-1) + y(i) \cdot \mu \cdot e(i),$$

where p is a constant controlling the adaption rate and preferably falls in a range of from about 0.01 to about 0.1 (most preferably equal to about 0.066), and where i=1, 2, 3, . . . designating the current sample period. Startup weights at sample period i=0 are predefined to any random values (e.g., $w_1(0)$ and $w_2(0)$ can be made equal to 0.5 times their maximum values).

The coherent signal from summer 47 is coupled to an automatic gain control (AGC) block 50 for adjusting the coherent signal to a peak magnitude equal to one (e.g., by multiplying each coherent signal sample by the reciprocal of an average value of the coherent signal averaged over several cycles). The AGC-adjusted coherent signal is coupled to a frequency doubler 51. The coherent signal is coupled to one input of a multiplier 52 and to the input of a 90° phase shifter 53. The phase-shifted signal is coupled to a second input of multiplier 52. Since the coherent signal is a sinusoidal signal, multiplier 52 performs the multiplication equivalent to a sine times a cosine resulting in an output signal equal to the cosine at twice the frequency of the coherent signal. The frequency-doubled signal is provided to one input of synchronous detector (i.e., mixer) 25.

The notch-filtered signal from summer 41 is coupled to the input of low-pass filter 16 and to the first input of synchronous detector 25. The notch-filtered signal has the FM stereo pilot signal stripped away, allowing low-pass filter 15 to be simplified and/or to provide improved performance.

Figure 4:
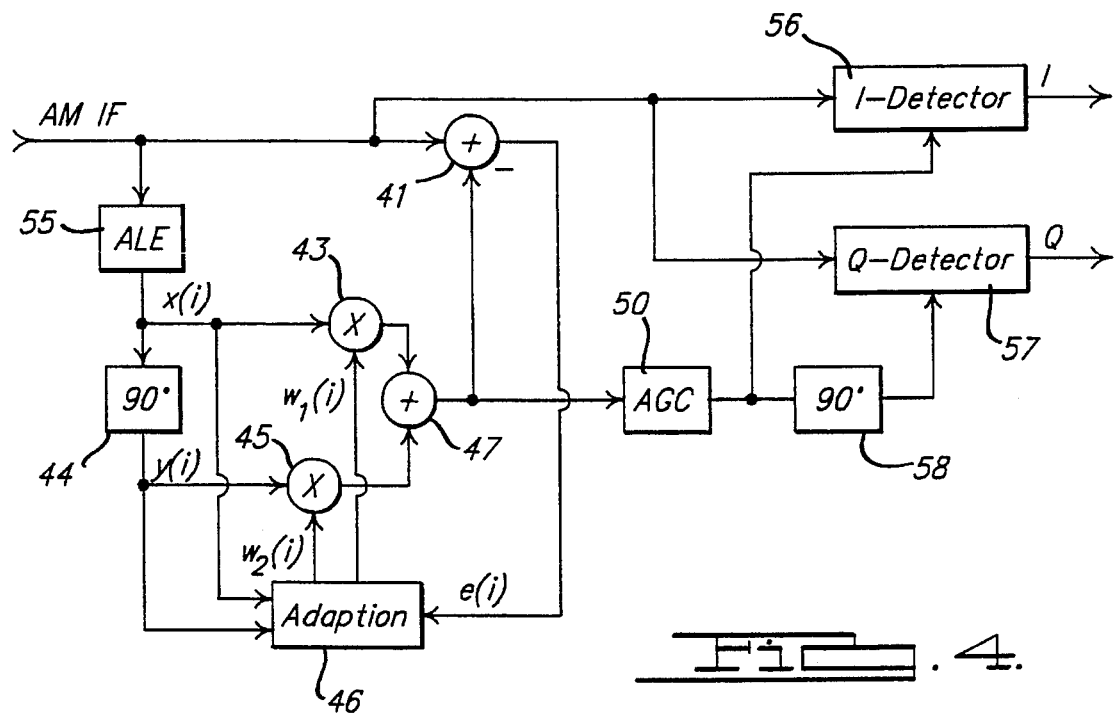
FIG. 4 is a block diagram showing an adaptive-notched filter generating a coherent signal for use in reception of AM stereo broadcasts.
Figure 3:
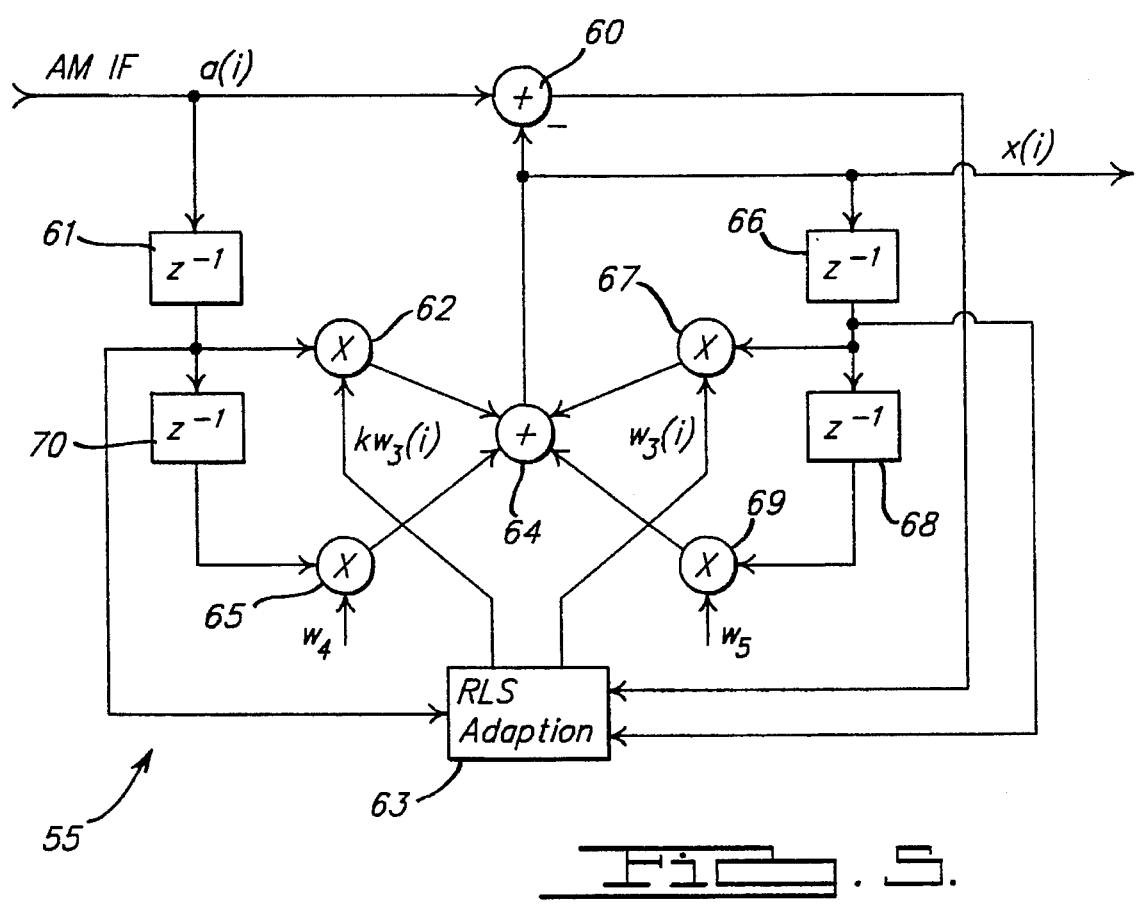

An alternative embodiment is shown in FIG. 4 for receiving an AM signal, specifically an AM stereo signal using quadrature encoding. In this case, it is desired to lock onto an intermediate frequency carrier signal. Because of variation in the actual frequency of the IF signal (caused by temperature variations in the analog tuner, for example), the adaptive notch filter is supplemented with an adaptive line enhancer to improve capture time and capture range. More specifically, an adaptive line enhancer is employed to provide the reference signal for the adaptive notch filter. The adaptive line enhancer functions as a passband filter with a variable center frequency for enhancing the carrier frequency in the AM IF signal.

Thus, the AM IF signal from an ADC (not shown) is coupled to the input of summer 41 and to the input of an adaptive line enhancer (ALE) 55. The enhanced carrier frequency signal provides the input signal x(i) to the adaptive notch filter.

In this embodiment, the AM IF signal is coupled to the input of an in-phase synchronous detector (I-detector) 56. The gain-adjusted coherent signal from AGC block 50 is coupled to a second input of I-detector 56. Synchronous detection generates an in-phase demodulated output I. In monophonic broadcasts, nothing further is required. However, for a quadrature modulated AM stereo signal, a quadrature-phase detector (Q-detector) 57 also receives the IF signal. The gain-adjusted coherent signal from AGC block 50 is phase shifted by 90° in a phase shifter 58. The shifted signal is provided to a second input of Q-detector 57 which produces a quadrature output signal Q. In quadrature AM broadcasting, output signal Q is the stereo difference signal. The I and Q output signals can then be decoded into stereo signals in a stereo decoder matrix.

ALE 55 is shown in greater detail in FIG. 5. ALE 55 takes the form of a recursive filter to provide a high Q factor to greatly attenuate the sideband signals in the AM signal. The input AM IF signal a(i) is coupled to one input of a summer 60 and to the input of a unit delay 61. The output of unit delay 61 is coupled to one input of a multiplier 62, the input of a unit delay 70, and one input of an RLS adaption block 63. Adaption block 63 provides a weight $w_3(i)$ multiplied by a constant "k" to a second input of multiplier 62 which multiplies the product k·$w_3(i)$ by the unit delayed signals from unit delay 61 and provides the result to one input of a summer 64. The output of unit delay 70 is coupled to one input of a multiplier 65 having its second input receiving a constant weight value $w_4$ and providing the product to a second input of summer 64.

The output of summer 64 is coupled to a subtracting input on summer 60. Further, the output of summer 64 provides the output signal $x(i)$ of ALE 55 to the adaptive notch filter. The output of summer 60 is an error signal which is further coupled to adaption block 63.

A recursive portion of ALE 55 includes a unit delay 66 receiving output signal $x(i)$. The unit delayed output of unit delay 66 is coupled to one input of a multiplier 67, the input of a unit delay 68, and to an input of adaption block 63. Adaption block 63 provides weight $w_3(i)$ to a second input of multiplier 67 which has its output coupled to summer 64. Unit delay 68 has its output coupled to an input of a multiplier 69. A fixed weight $w_5$ is provided to the second input of multiplier 69 and the product of multiplier 69 is coupled to an input of summer 64.

Each output sample $x(i)$ of ALE 55 is thus defined according to the following:

$$x(i)=a(i-1)k\,w_3(i)+a(i-2)w_4+x(i-1)w_3(i)+x(i-2)w_5.$$

Adaption block 63 performs a recursive least mean squares (RLS) method to minimize the error signal error(i). Thus, weight $w_3(i)$ is determined by:

$$w_3(i)=w_3(i-1)+k\mu error(i)a(i-1)+x(i-1),$$

where $\mu$ is the adaption rate constant, and where the constant k is determined by the Q factor of ALE 55. Constant weights $w_4$ and $w_5$ determine the Q factor which is preferably about 175, while weight $w_3$ determines the center frequency.

What is claimed is:

1. A radio receiver generating a coherent signal in response to an input frequency in an input signal, comprising:

a summer having first and second inputs and an output for generating a notch-filtered signal according to the difference between signals applied to said first and second inputs, said first input being coupled to receive said input signal and said second input being coupled to receive said coherent signal;

a signal source providing a reference signal having a frequency about equal to said input frequency;

an adaptive filter receiving said reference signal and said notch-filtered signal for generating said coherent signal such that said notch-filtered signal is minimized;

a normalizer receiving said coherent signal and providing automatic gain control to generate a normalized coherent signal; and mixer means coupled to said summing means and said normalizer for mixing said notch-filtered signal in response to said normalized coherent signal.

2. The receiver of claim 1 wherein said normalizer multiplies said coherent signal by the reciprocal of an average value of said coherent signal.

3. A method of processing an AM IF signal including a carrier signal, said method comprising the steps of:

enhancing said carrier signal from said AM IF signal using an adaptive line enhancer;

coupling said AM IF signal to one input of a synchronous detector;

averaging said enhanced carrier signal to form an average;

multiplying said enhanced carrier signal by a reciprocal of said average to form a gain-adjusted coherent signal; and coupling said gain-adjusted coherent signal to another input of said synchronous detector to produce a demodulated output.

\* \* \* \* \*